United States Patent
Hsin et al.

(10) Patent No.: US 8,836,252 B2
(45) Date of Patent: Sep. 16, 2014

(54) LINEARIZED CONTROL OF PIEZOELECTRIC ACTUATOR TO REDUCE HYSTERESIS

(71) Applicant: Nikon Corporation, Chiyoda-ku (JP)

(72) Inventors: Yi-Ping Hsin, Dublin, CA (US); Susumu Isago, Kita-ku (JP); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 144 days.

(21) Appl. No.: 13/656,909

(22) Filed: Oct. 22, 2012

(65) Prior Publication Data

US 2014/0055060 A1    Feb. 27, 2014

Related U.S. Application Data

(60) Provisional application No. 61/628,011, filed on Oct. 21, 2011.

(51) Int. Cl.
*H01L 41/09*       (2006.01)

(52) U.S. Cl.
CPC .................................. *H01L 41/09* (2013.01)
USPC ............................ 318/116; 318/34; 318/558

(58) Field of Classification Search
CPC ........................................................ H01L 41/09
USPC ........................................... 318/116, 34, 558
See application file for complete search history.

(56) References Cited

U.S. PATENT DOCUMENTS

| 5,424,597 A | 6/1995 | Glöss et al. |
| 5,949,177 A | 9/1999 | O'Brien et al. |
| 6,109,245 A | 8/2000 | Egger et al. |
| 7,982,375 B2 * | 7/2011 | Tan et al. .................. 310/338 |
| 2003/0085633 A1 | 5/2003 | Marth |

FOREIGN PATENT DOCUMENTS

EP         1 759 427 B1    6/2005
WO    WO 2006/000337 A1    1/2006

* cited by examiner

*Primary Examiner* — David Luo
(74) *Attorney, Agent, or Firm* — Klarquist Sparkman, LLP (57) ABSTRACT

An exemplary piezoelectric actuator includes a piezoelectric transducer that exhibits displacements when energized with corresponding voltages. A control system is electrically connected to the piezoelectric transducer so as to provide the transducer with the voltages. The control system includes feedback of displacements of the transducer as functions of respective voltage commands and feed-forward of electrical currents passing through the transducer as functions of the respective voltages applied to the transducer. The control system further has a feedback controller connected to receive transducer-displacement data corresponding to the voltages applied to the transducer. The control system further can include a current-feed-forward amplifier connected to receive transducer-current data corresponding to the voltages applied to the transducer. Such a control system facilitates reduction of hysteresis in controlled actuation of the actuator.

24 Claims, 11 Drawing Sheets

LINEARIZED CONTROL OF PIEZOELECTRIC ACTUATOR TO REDUCE HYSTERESIS

CROSS-REFERENCE TO RELATED APPLICATION

This application claims priority to, and the benefit of, U.S. Provisional Application No. 61/628,011, filed on Oct. 21, 2011, which is incorporated herein by reference in its entirety.

FIELD

This disclosure pertains to, inter alia, piezoelectric actuators and devices for driving such actuators.

BACKGROUND

Piezoelectric actuators are widely used in various precision systems for displacement purposes. A piezoelectric actuator is a type of transducer that converts applied electrical voltage into a corresponding mechanical displacement or stress by exploiting the piezoelectric effect. These actuators also do the reverse, i.e., convert mechanical stress into corresponding voltage. Piezoelectric actuators generally have excellent responsiveness and are efficient in converting applied voltage to mechanical displacement. As a result, various types of piezoelectric actuators are commercially available and widely used. For example, piezoelectric actuators are used in various high-precision moving and positioning mechanisms because these actuators can perform minute mechanical displacements at high speed, in a predictable manner, at high precision, and with substantial force. Since the displacement exhibited by a single piezoelectric element when electrically energized is typically small, actual displacement can be multiplied by configuring an actuator with multiple piezoelectric elements arranged in a stack and collectively energized. Since the individual displacements are additive, this arrangement can produce a large displacement using a low driving voltage.

Piezoelectric actuators are used for producing high-precision positioning in, for example, microlithography systems. An exemplary application in which this positioning can be used in a microlithography system is in the positioning of a workpiece mounted on a stage or the positioning of a lens element in an imaging optical system.

Typically, a piezoelectric actuator used for movement or positioning includes a control system to ensure that voltage commands delivered to the actuator cause the actuator to produce a desired corresponding response. The control system includes a driver that delivers selected voltages to the actuator according to the input commands. The actuator responds to the voltages by elongating or retracting a corresponding amount, within certain limits.

In some instances, the elongation of a piezoelectric actuator driven by a voltage-controlled driver exhibits hysteresis. Hysteresis imparts a corresponding non-linearity to the operation of the actuator, which can reduce the accuracy and precision with which movements and placements are being performed by the actuator. In some applications, such as lens-position-control systems, non-linear behavior can limit the utility of the control system(s) that include the actuator(s). Also, in general, non-linear behavior is more difficult to predict, and hence more difficult to control, than linear behavior.

Figure 1:
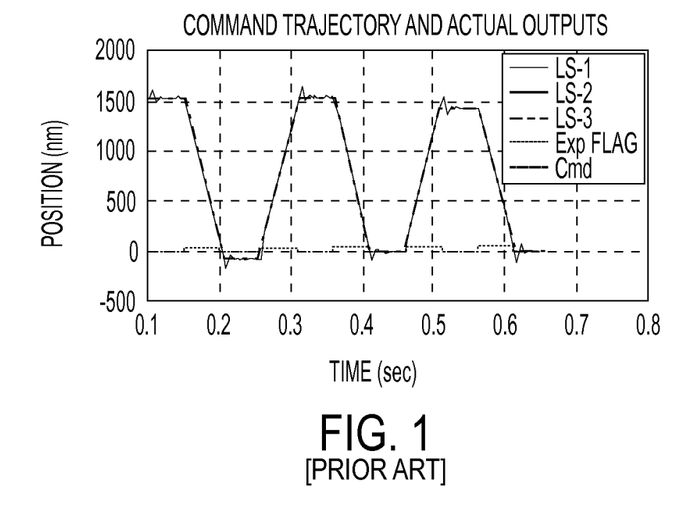
FIG. 1 is a plot exhibiting an exemplary hysteresis phenomenon evident in a commanded trajectory of a conventional piezoelectric actuator receiving a periodically reversing voltage command.
Figure 2:
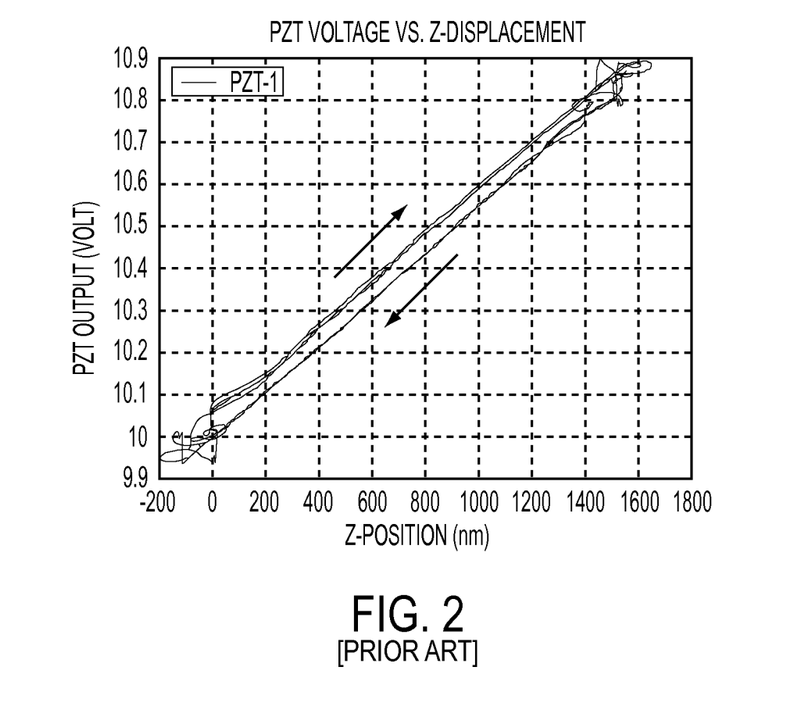
FIG. 2 depicts the hysteresis, shown in FIG. 1, using a plot of voltage delivered to the piezoelectric actuator versus the resulting actual Z-position of the actuator.

An exemplary depiction of this hysteresis phenomenon is shown in FIG. 1, which depicts the commanded trajectory of a particular piezoelectric actuator receiving a periodically reversing voltage command. The ordinate is position, and the abscissa is time. Nearly superposed on the commanded trajectory are traces of respective actual trajectory as sensed simultaneously by three laser scales LS-1, LS-2, LS-3. Note that all three actual trajectory traces include a transient spike or blip whenever the trajectory reaches its maximum and whenever the trajectory reaches its minimum. Another way in which to depict the hysteresis is shown in FIG. 2, which is a plot of voltage delivered to the piezoelectric actuator versus the resulting actual Z-position of the actuator. The plot depicts several phenomena constituting the hysteresis. One phenomenon is that increasing piezoelectric length by progressively increasing the voltage delivered to the actuator and decreasing piezoelectric length (i.e., contracting the piezoelectric) by progressively decreasing the voltage are not colinear. There is a vertical displacement between the elongation and retraction plots, representing a corresponding change in offset voltage whenever the moving direction is switched. Another phenomenon revealed in FIG. 2 is the variability of the position of the actuator at both the upper and lower termini of the plots.

Figure 3:
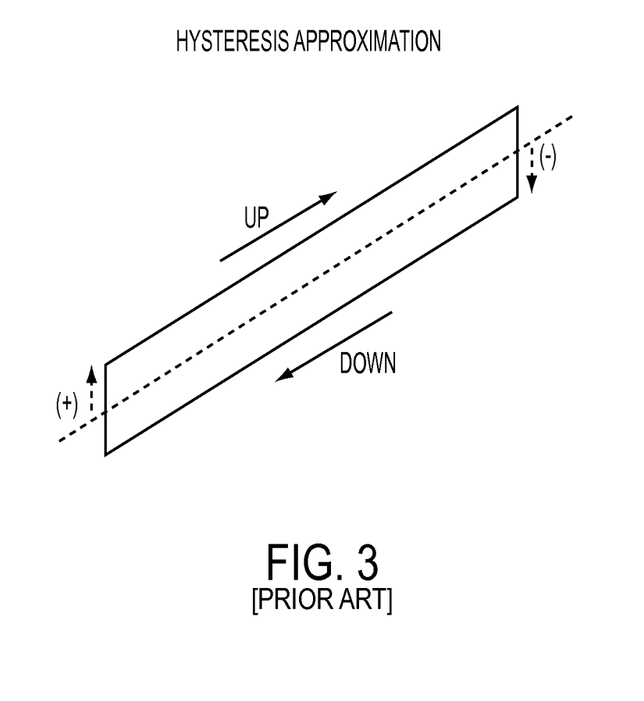

A schematic approximation of the hysteresis shown in FIG. 2 is depicted in FIG. 3, which shows a positive (+) directional offset upon commencing elongation of the piezoelectric actuator ("up" arrow) and a negative (−) directional offset (upon commencing retraction of the actuator ("down" arrow). Successively changing the command to the actuator from elongate to retract and from retract to elongate produces the parallelogram-shaped plot shown in FIG. 3. Although a linear average (dashed line) can be deduced from these plots, the actual performance of the system within the parallelogram is not completely definable so long as the hysteresis is present. Note that the directional offsets become greater with increased distance between the maximum and minimum of the plot (i.e., with increased distance between fully retracted and fully extended; the fully retracted and fully extended states are denoted by the left and right ends of the parallelogram, respectively).

This disclosure sets forth a simple, convenient, and effective way in which to reduce hysteresis and hence to produce more precisely controlled movements of a piezoelectric actuator.

SUMMARY

An exemplary actuator comprises a piezoelectric transducer that exhibits displacements when energized with corresponding voltages. A control system is electrically connected to the piezoelectric transducer so as to provide the transducer with the voltages. The control system includes feedback of displacements of the transducer as functions of respective voltage commands and feed-forward of electrical currents passing through the transducer as functions of the respective voltages applied to the transducer. The control system can further comprise a feedback controller connected to receive transducer-displacement data corresponding to the voltages applied to the transducer. The control system can further comprise a current-feed-forward amplifier connected to receive transducer-current data corresponding to the voltages applied to the transducer.

The foregoing and additional features and advantages of the invention will be more readily apparent from the following detailed description, which proceeds with reference to the accompanying drawings.

BRIEF DESCRIPTION OF THE DRAWINGS

FIG. 3 is a schematic approximation of the hysteresis shown in FIG. 2, wherein FIG. 3 shows a positive directional offset upon commencing elongation of the piezoelectric actuator and a negative directional offset upon commencing retraction of the actuator.

FIGS. 7A-7C are respective plots of exemplary data obtained with a piezoelectric actuator controlled by a control scheme including current feed-forward (FIGS. 4A-4B), wherein FIG. 7B is a plot of current.

FIGS. 10A-10B serve as experimental controls for FIGS. 9A-9B, respectively.

DETAILED DESCRIPTION

The invention is described below in the context of exemplary embodiments that are not intended to be limiting in any way.

The drawings illustrate the general manner of construction and are not necessarily to scale. In the detailed description and in the drawings themselves, specific illustrative examples are shown and described herein in detail. It will be understood, however, that the drawings and the detailed description are not intended to limit the invention to the particular forms disclosed, but are merely illustrative and intended to teach one of ordinary skill how to make and/or use the invention claimed herein.

As used in this application and in the claims, the singular forms "a," "an," and "the" include the plural forms unless the context clearly dictates otherwise. Additionally, the term "includes" means "comprises." Further, as applicable, the term "coupled" encompasses hydraulic, pneumatic, mechanical, electrical, as well as other practical ways of coupling or linking items together, and does not exclude the presence of intermediate elements between the coupled items.

The described things and methods described herein should not be construed as being limiting in any way. Instead, this disclosure is directed toward all novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

A system that exhibits hysteresis can indicate a certain lack of control of the system. Applicants discovered that hysteresis exhibited by a piezoelectric actuator can be reduced by providing a hybrid driver for the actuator. "Hybrid" as used here means that the driver control is based not on a single parameter but rather on a combination of parameters. In a conventional control scheme for a piezoelectric actuator, control is based on feedback of data produced by a position sensor(s) that senses the position of the piezoelectric (or thing mounted to it). The position detected by the position sensor(s) is a function of corresponding voltage commands delivered to the actuator. Applicants have discovered that using data derived from voltage commands delivered to the actuator as well as data concerning electrical current delivered to the actuator, particularly in which current is utilized as a feed-forward signal and position is utilized as a feedback signal, provides improved control of the actuator. More specifically, the combination of the feed-forward signal and the feedback signal provides a more linear actuation (expansion and contraction) of the piezoelectric actuator than obtained when basing control only on feedback of position data. These improvements, in turn, produce more accurate and precise movements and positionings performed by the actuator.

For example, in microlithography systems, certain optical elements in a projection optical system have mountings that include piezoelectric elements. With such optical systems, using the piezoelectric elements for intra-shot lens control can be effective for, e.g., image compensation during exposures. But, the compensation range is currently limited due mainly to certain actuation variables (generally of a non-linear nature) of the piezoelectric actuator(s) that are not optimally controlled. To extend the range and types of applications involving piezoelectric actuators (for example, reticle bending), more linear control of the piezoelectric actuators is required, especially for long-stroke applications.

Figure 4A:
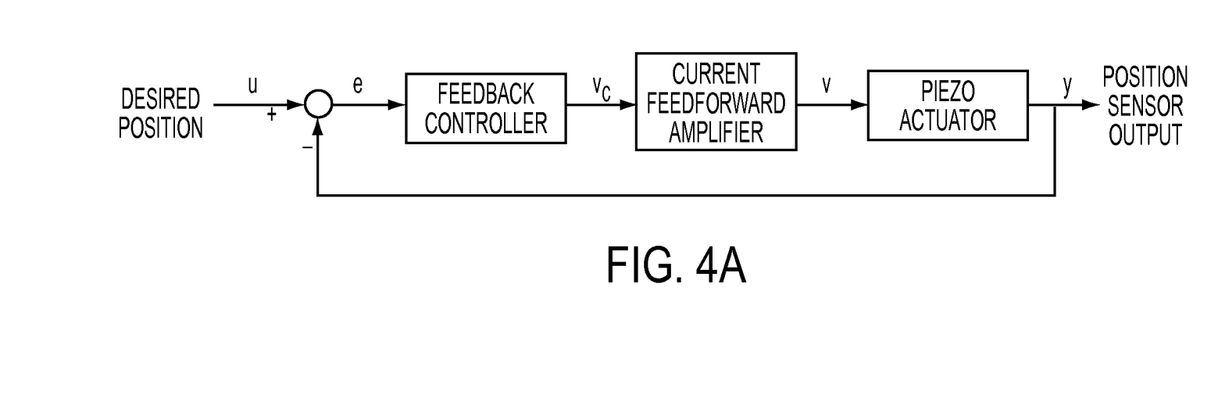
FIG. 4A is a control diagram of an embodiment of a scheme for controlling operation of a piezoelectric actuator, showing a current-feed-forward amplifier placed relative to a feedback controller and respective piezoelectric actuator.
Figure 4B:
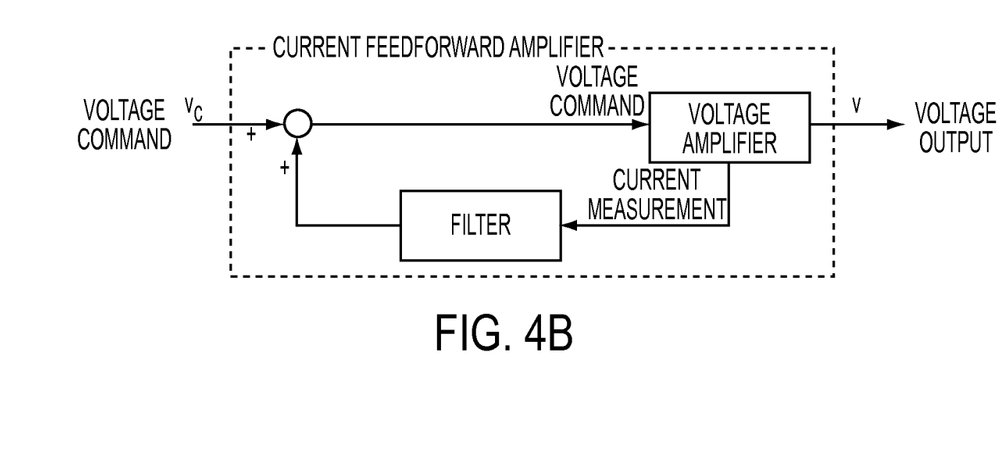
FIG. 4B is a control diagram of the current-feed-forward amplifier portion shown in FIG. 4A.

Reference is now made to FIGS. 4A-4B, which depict a representative embodiment of a control scheme for a piezoelectric actuator. FIG. 4A depicts the general control scheme, comprising a feedback controller, a current feed-forward amplifier, and the piezoelectric ("piezo") actuator. The feedback controller receives inputs regarding detected position of the actuated piezo actuator. The current feed-forward amplifier receives feedback-controlled voltage commands ($V_c$) from the feedback controller. Corresponding output voltages (V) from the current feed-forward amplifier are delivered to the piezo actuator. The magnitude of displacement of the piezo actuator, measured by at least one position sensor, is a function of the output voltage (V). In the current feed-forward amplifier (FIG. 4B), the voltage commands V, are also the basis of measurements of electrical current performed by the voltage amplifier. The measured currents pass through a filter, and the output of the filter is routed to upstream of the voltage amplifier, thereby providing the feed-forward signal. Thus, control of the piezo actuator is based not only on actuator displacement as a function of applied voltage (utilized as a feedback signal) but also on feed-forward of corresponding electrical current delivered to the piezo actuator (also called a "piezo transducer"). In this control scheme, the current measurements and their use as the basis of feed-forward signals reduce hysteresis of the piezo actuator. This correction is facilitated by the measurement of current in the voltage command being sensitive to the moving direction of the actuator and hence its usefulness as a hysteresis-prediction signal. In FIG. 4B, the filter in this embodiment is a low-pass filter, which is effective for reducing noise. The nominal frequency (and bandwidth associated therewith) of the filter depends upon the particular application, especially on the existing noise.

Figure 5:
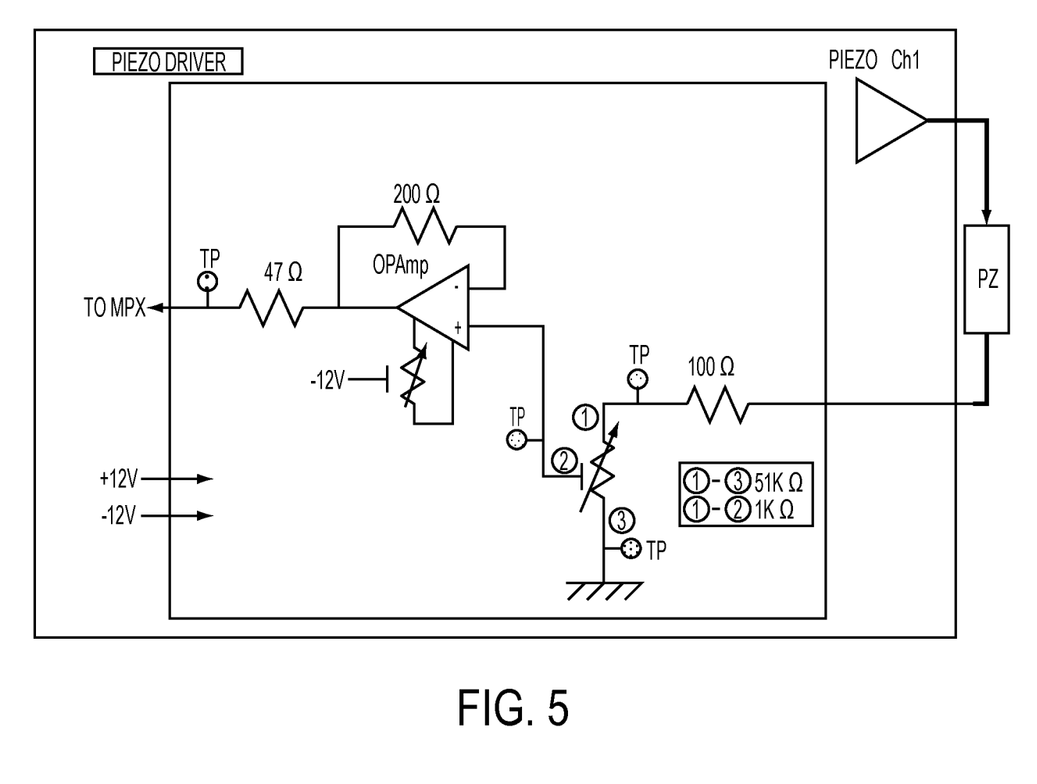
FIG. 5 is a schematic diagram of an exemplary circuit for obtaining measurement of electrical current drawn by a piezoelectric actuators) as the actuator(s) respond to a voltage command routed to the piezoelectric actuator(s).

An exemplary circuit for producing current measurements from corresponding voltage commands routed to a piezoelectric actuator is shown schematically in FIG. 5. The circuit can be incorporated on a "driver board" containing circuitry (including respective driver amplifiers) used for driving respective piezo actuators with respective voltage commands. The circuit includes an isolation amplifier ("OP Amp"). Voltage output from the piezo actuator (currently being "driven") is trimmed by a rheostat and routed to the + input of the amplifier. The amplifier's output is fed back to the – input of the isolation amplifier. A second rheostat provides an offset adjustment for the amplifier. The output of the amplifier corresponds to a measured current.

Figure 6:
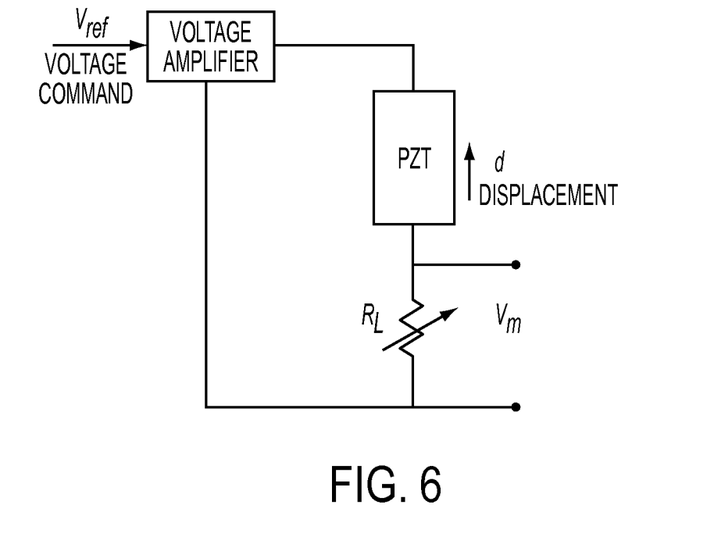
FIG. 6 is a schematic diagram of an exemplary manner in which current is measured.

FIG. 6 depicts a voltage amplifier connected to a piezoelectric transducer ("PZT", i.e., a piezoelectric actuator), which exhibits a displacement (e.g., elongation) upon being energized with a corresponding voltage from the voltage amplifier, according to a corresponding voltage command. If elongation (x) of the PZT is proportional to its charge value (q), i.e., if $x = K \cdot q$ (wherein K is a proportionality constant) then with a conventional piezoelectric channel:

$$\frac{q}{c} = V \tag{1}$$

in which C is the capacitance of the piezoelectric actuator, and V is voltage. Hence, $$\frac{x}{V} = K \cdot C \tag{2}$$

With a piezoelectric actuator controlled as described above, $$\frac{q}{c} + R \cdot \dot{q} = V \tag{3}$$

in which R is resistance of the actuator. Hence, $$\frac{x}{V} = \frac{KC}{(RC \cdot s + 1)} \tag{4}$$

which is a first-order (linear) system. In this system the measured voltage $V_m$ is proportional to the current flow into the piezoelectric actuator. During current measurement, it is desirable to consume a low cross-voltage drop, which will not reduce the maximum stroke of the piezoelectric actuator.

Figure 7A:
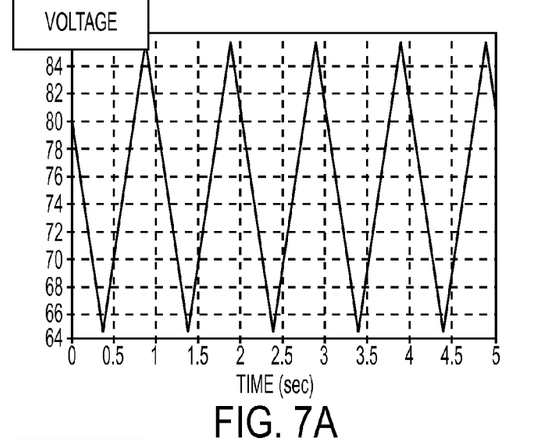
FIG. 7A is a plot of voltage.
Figure 7B:
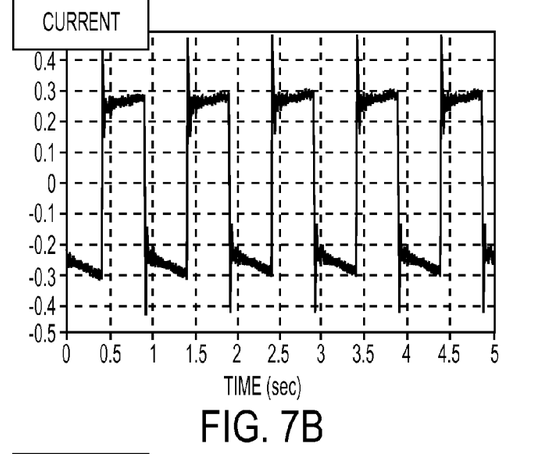
Figure 7C:
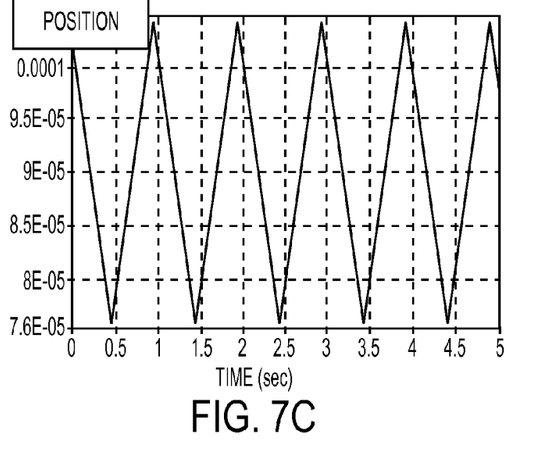
FIG. 7C is a plot of position.

Example results obtained with a piezoelectric actuator controlled by a control scheme including current feed-forward (FIGS. 4A-4B) are shown in FIGS. 7A-7C and 8. Turning first to FIG. 7A, a plot of voltage is shown, in which the voltage was changed in a periodic saw-tooth manner over time. Note that the apices of the saw-teeth have significantly reduced transient spikes and blips compared to the plot shown in FIG. 1. A plot of corresponding current is shown in FIG. 7B, in which the spikes correspond to respective spikes in FIG. 7A. A plot of actual position of the piezoelectric transducer is shown in FIG. 7C (data obtained with the filter in place, see FIG. 4B). Note that the apex of each saw-tooth is nearly blip-free, especially in contrast to FIG. 1.

Figure 8:
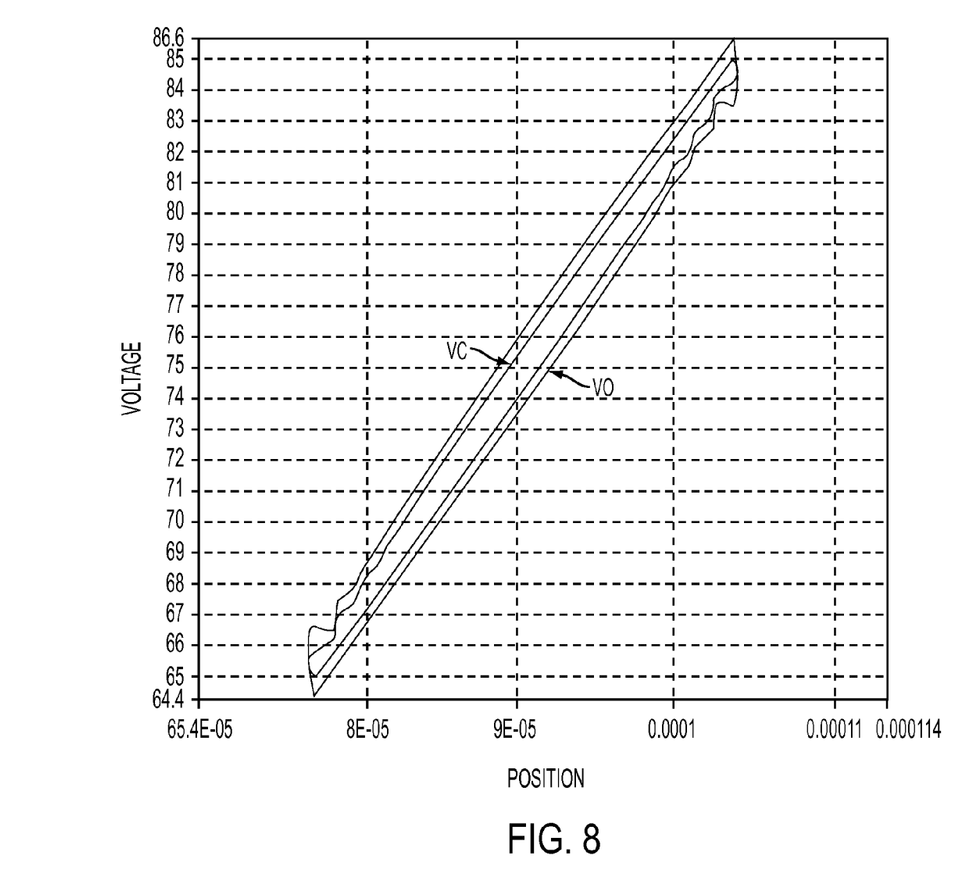
FIG. 8 is similar to FIG. 2, but reveals substantially less hysteresis than in FIG. 2 as a result of the piezoelectric actuator of FIG. 8 being controlled according to the scheme shown in FIGS. 4A-4B.

FIG. 8 is similar to FIG. 2, but reveals substantially less hysteresis than FIG. 2. In FIG. 8 the narrower parallelogram is of hysteresis associated with voltage commands versus position, whereas the wider parallelogram is of hysteresis associated with voltage output versus position. Generally, the hysteresis of the piezoelectric transducer controlled as shown in FIG. 3 (narrower parallelogram) is approximately half the hysteresis shown in FIG. 2. FIG. 8 also lacks any indication of DC drift, and the plot still has the appearance of the transducer being controlled by a voltage amplifier.

Figure 9A:
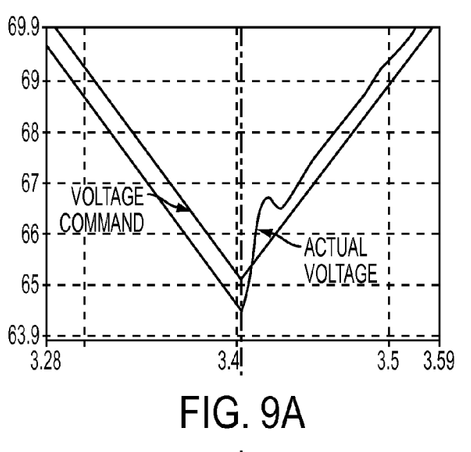
FIGS. 9A-9B are plots of voltage versus time (FIG. 9A) and position versus time (FIG. 9B) of piezoelectric actuator actuated using a saw-tooth energization scheme and controlled with current feed-forward as shown in FIGS. 4A-4B.
Figure 9B:
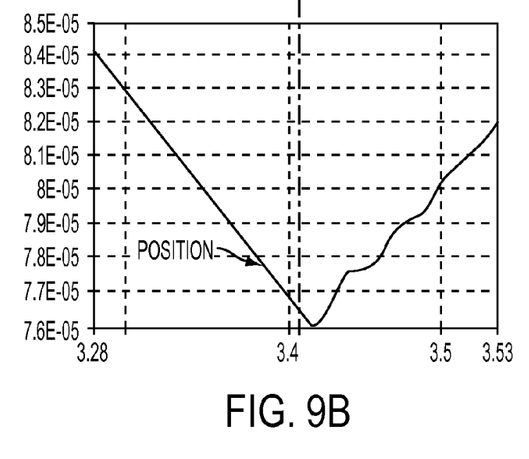
Figure 10A:
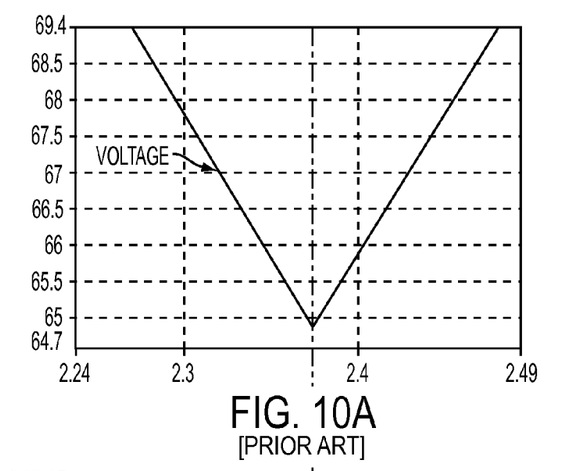
FIGS. 10A-10B are plots, similar to those in FIGS. 9A-9B, respectively, but of data obtained from piezoelectric actuator controlled in the conventional voltage-only manner.
Figure 10B:
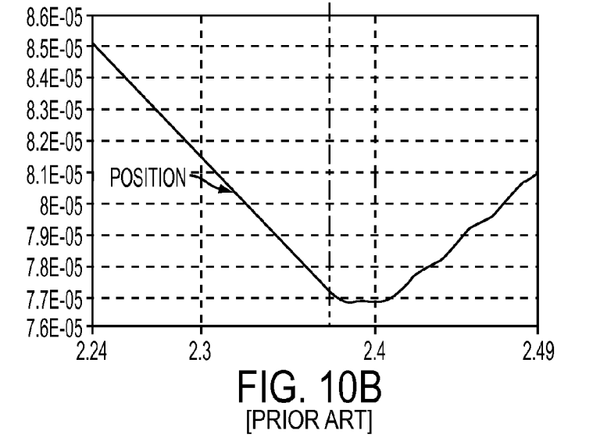

Reference is now made to FIGS. 9A-9B, depicting plots of voltage versus time (FIG. 9A) and position versus time (FIG. 9B) of a one saw-tooth apex, as obtained with a piezoelectric transducer controlled with current feed-forward as shown in FIGS. 4A-4B. In FIG. 9A the voltage command has a sharp apex as expected. The plot of actual voltage shows a blip near the apex, but it must be kept in mind that the data in this plot are controlled by a scheme as shown in FIGS. 4A-4B, in which current feed-forward is taken into account. FIG. 10A is an experimental "control," illustrated as a plot of the apex of the saw-tooth voltage output from the amplifier without current feed-forward control. FIG. 9B is a plot of position, as realized by the piezoelectric actuator being controlled by the scheme shown in FIG. 4. Comparing FIG. 9B with FIG. 10B, it can be readily seen that there is substantially less hysteresis in FIG. 9B than in FIG. 10B. Note the flattened apex in FIG. 10B, compared to FIG. 9B. Hence, output voltage including a current feed-forward signal can be used to obtain a sharp change of motion direction.

Figure 11:
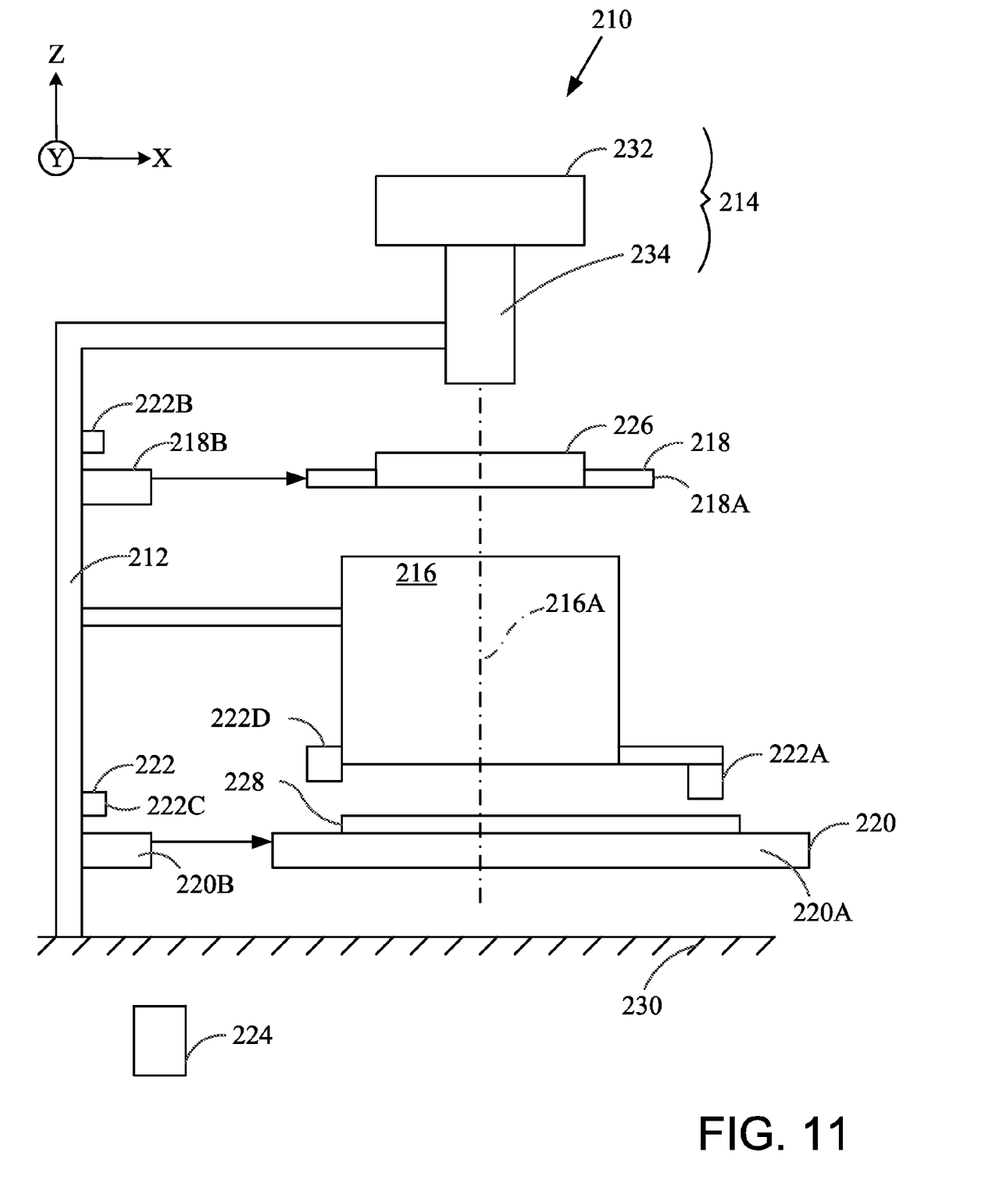
FIG. 11 is a schematic diagram of a microlithographic exposure system, as a representative precision system, including features of the invention described herein.

Included in this disclosure are various precision systems comprising a component that is positioned or moved at high accuracy and precision using at least one piezoelectric actuator. An exemplary precision system is a microlithography system or exposure "tool" used for manufacturing semiconductor devices. A schematic depiction of an exemplary microlithography system 210, comprising features of the invention described herein, is provided in FIG. 11. The system 210 includes a system frame 212, an illumination system 214, an imaging-optical system 216, a reticle-stage assembly 218, a substrate-stage assembly 220, a positioning system 222, and a system-controller 224. The configuration of the components of the system 210 is particularly useful for transferring a pattern (not shown) of an integrated circuit from a reticle 226 onto a semiconductor wafer 228. The system 210 mounts to a mounting base 230, e.g., the ground, a base, or floor or other supporting structure.

Figure 12:
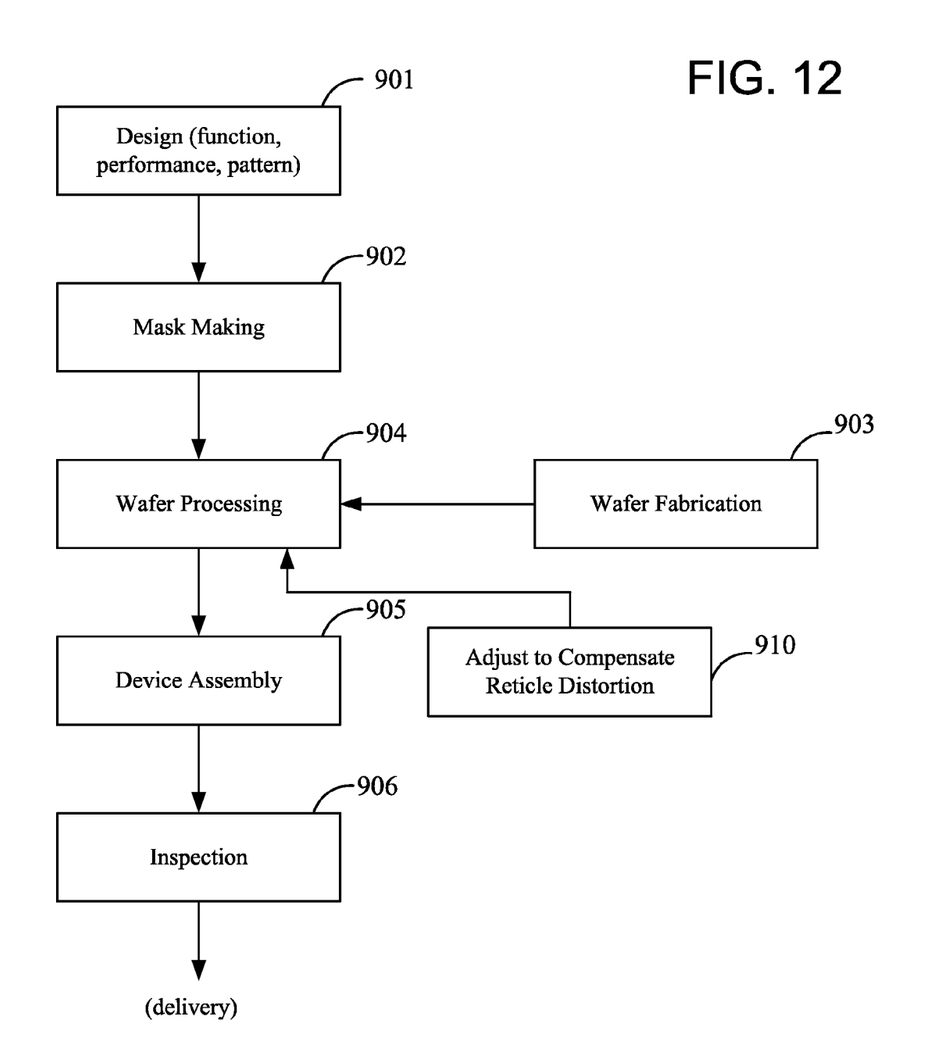
FIG. 12 is a flow-chart outlining a process for manufacturing a semiconductor device in accordance with the invention.

An exemplary process for manufacturing semiconductor devices, including an exposure step, is shown in FIG. 12. In step 901 the device's function and performance characteristics are designed. Next, in step 902, a mask (reticle) having a desired pattern is designed according to the previous designing step, and in a parallel step 903 a wafer is made from a suitable semiconductor material. The mask pattern designed in step 902 is exposed onto the wafer from step 903 in step 904 by a microlithography system described herein in accordance with the present invention. In step 905 the semiconductor device is assembled (including the dicing process, bonding process, and packaging process). Finally, the device is inspected in step 906.

Figure 13:
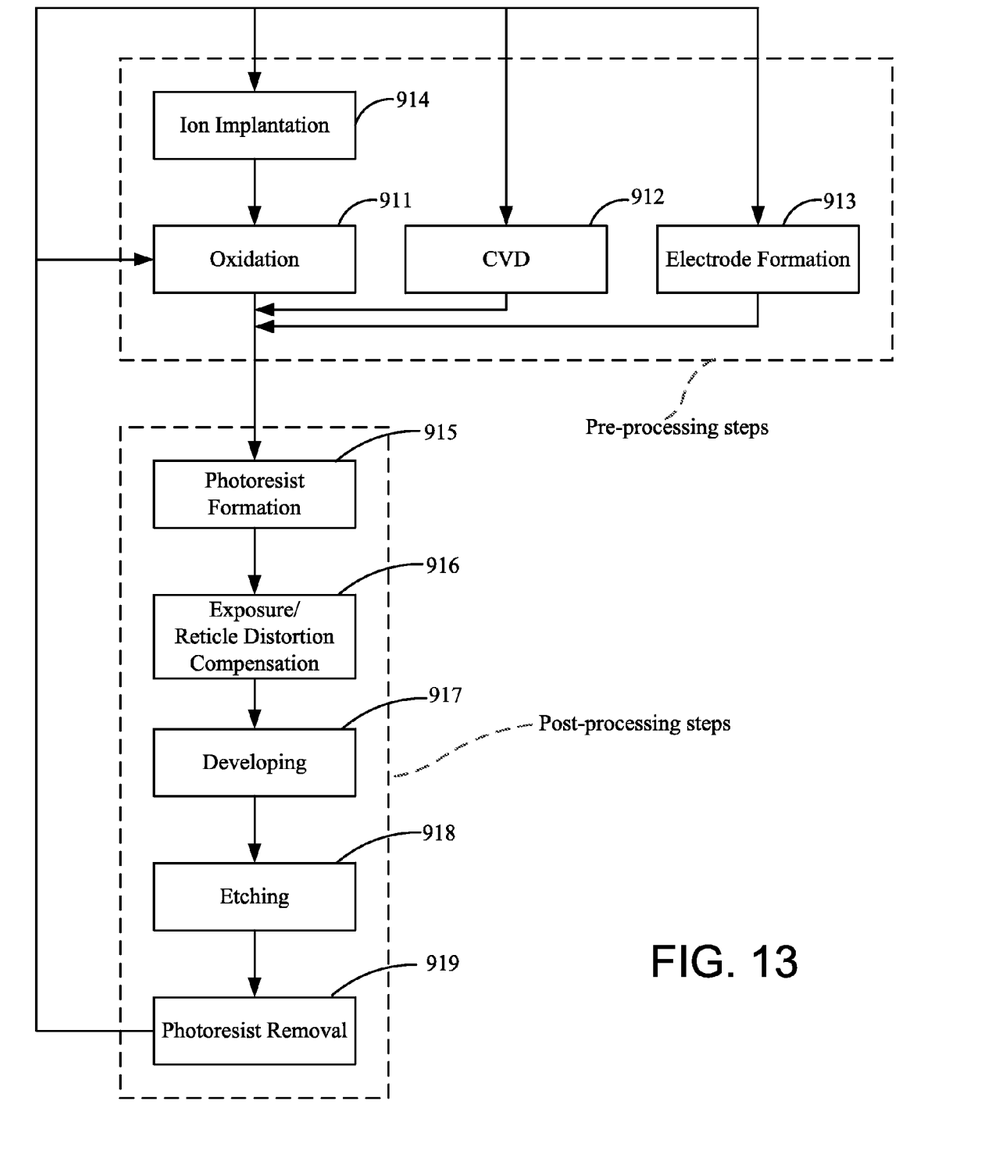
FIG. 13 a flow-chart of a portion of a device-manufacturing process in more detail.

FIG. 13 is a flowchart of the above-mentioned step 904 in the case of fabricating semiconductor devices. In FIG. 13, in step 911 (oxidation step), the wafer surface is oxidized. In step 912 (CVD step), an insulation film is formed on the wafer surface. In step 913 (electrode-formation step), electrodes are formed on the wafer by vapor deposition. In step 914 (ion-implantation step), ions are implanted in the wafer. The above-mentioned steps 911-914 constitute the preprocessing steps for wafers during wafer processing, and selection is made at each step according to processing requirements.

At each stage of wafer-processing, when the preprocessing steps have been completed, the following "post-processing" steps are implemented. During post-processing, first, in step 915 (photoresist-formation step), photoresist is applied to a wafer. Next, in step 916 (exposure step), the above-mentioned exposure device is used to transfer the circuit pattern of a mask (reticle) to a wafer. Then, in step 917 (developing step), the exposed wafer is developed, and in step 918 (etching step), parts other than residual photoresist (exposed material surface) are removed by etching. In step 919 (photoresist-removal step), unnecessary photoresist remaining after etching is removed. Multiple circuit patterns are formed by repeating these pre-processing and post-processing steps.

The subject apparatus can readily be used in any of various precision systems utilizing at least one piezoelectric actuator to move an object, such as an object manipulated or worked by the precision system, or a component of the precision system. An example precision system is a microlithography system.

What is claimed is:

1. An actuator, comprising:
    a piezoelectric transducer that exhibits displacements when energized with corresponding voltages; and
    a control system electrically connected to the piezoelectric transducer so as to provide the transducer with the voltages, the control system including feedback of displacements of the transducer as functions of respective voltage commands and feed-forward of electrical currents passing through the transducer as functions of the respective voltages applied to the transducer.

2. The actuator of claim 1, wherein the control system further comprises a feedback controller connected to receive transducer-displacement data corresponding to the voltages applied to the transducer.

3. The actuator of claim 2, wherein the control system further comprises a current-feed-forward amplifier connected to receive transducer-current data corresponding to the voltages applied to the transducer.

4. The actuator of claim 3, wherein the current-feed-forward amplifier comprises a voltage amplifier that receives a voltage command from the feedback controller, the voltage amplifier producing, from the voltage command, an output causing a respective actuation of the piezoelectric transducer.

5. The actuator of claim 4, wherein the current feed-forward amplifier includes a current-measuring circuit connected to the voltage amplifier and configured to determine a corresponding electrical current from the voltage command.

6. The actuator of claim 3, wherein the current feed-forward amplifier further comprises a filter connected to perform at least one of the following:
    receive the determined electrical current from the voltage amplifier,
    remove at least some noise from the determined electrical current,
    determine a voltage corresponding to the filtered electrical current, and
    add the determined voltage to the command voltage.

7. The actuator of claim 6, wherein an output of the filter is connected to be combined with a voltage command upstream of the feedback controller.

8. The actuator of claim 3, wherein the feedback controller is connected in the control system such that:
    the voltage feedback controller is electrically connected to receive data fed back from at least one position sensor associated with the piezoelectric transducer; and
    the current feed-forward amplifier is electrically connected between the feedback controller and the piezoelectric transducer.

9. The actuator of claim 8, wherein the current feed-forward amplifier further comprises a filter connected to deliver a voltage corresponding to the determined electrical current to upstream of the voltage amplifier for addition to the command voltage.

10. The actuator of claim 9, wherein:
    the current feed-forward amplifier comprises a voltage amplifier that receives a command voltage from the feedback controller for causing a respective actuation of the piezoelectric transducer; and
    the current feed-forward amplifier includes a current-measuring circuit connected to the voltage amplifier and configured to determine a corresponding electrical current from the command voltage.

11. The actuator of claim 10, wherein the current feed-forward amplifier further comprises a filter connected so that the determined electrical current is passed back to upstream of the voltage amplifier and added to the voltage command.

12. The actuator of claim 11, wherein the filter is a low-pass filter.

13. The actuator of claim 8, wherein:
    the current feed-forward amplifier comprises a voltage amplifier that receives a command voltage from the feedback controller for causing a respective actuation of the piezoelectric transducer; and
    the current feed-forward amplifier includes a current-measuring circuit connected to the voltage amplifier and configured to determine a corresponding electrical current from the command voltage.

14. The actuator of claim 13, wherein the current feed-forward amplifier further comprises a filter connected so that the determined electrical current is passed back to upstream of the voltage amplifier to be added to the voltage command.

15. The actuator of claim 14, wherein the filter is a low-pass filter.

16. The actuator of claim 3, wherein the feed-forward amplifier feeds-forward the currents to reduce operational hysteresis of the piezoelectric transducer compared to the transducer being controlled by the control system lacking the current feed-forward amplifier.

17. A precision system, comprising an actuator as recited in claim 1.

18. The precision system of claim 17, configured as a microlithography system.

19. An actuator, comprising:
a piezoelectric transducer;
a driver system electrically connected to the piezoelectric transducer and supplying respective voltage commands to the piezoelectric transducer to cause respective displacements of the piezoelectric transducer;
a position sensor sensing displacement of the piezoelectric transducer; and
a control system including the driver system, a feedback controller of voltage commands to the piezoelectric transducer as affected by fed-back outputs of the position sensor, and a feed-forward amplifier of respective electrical currents passing through the piezoelectric transducer corresponding to the respective voltage commands.

20. A precision system, comprising an actuator as recited in claim 19.

21. The precision system of claim 20, configured as a microlithography system.

22. A method for electrically energizing a piezoelectric actuator, comprising:
determining a desired position to be reached by the actuator;
determining a voltage command corresponding to the position;
feedback-controlling the voltage command based on a sensed actual position reached by the actuator;
feed-forwarding to the voltage command a voltage corresponding to a measured current in the voltage command as delivered to the piezoelectric actuator.

23. The method of claim 22, wherein feed-forwarding the voltage comprises:
amplifying the voltage command;
measuring an electrical current associated with the amplified voltage command; and
feeding-forward the measured electrical current as a corresponding voltage to the voltage command.

24. The method of claim 23, further comprising filtering the measured current to remove at least one component of electrical noise from the corresponding voltage.

* * * * *